US009935583B2

(12) United States Patent
Abe et al.

(10) Patent No.: US 9,935,583 B2
(45) Date of Patent: Apr. 3, 2018

(54) POWER AMPLIFIER CIRCUIT

(71) Applicant: Panasonic Corporation, Osaka (JP)

(72) Inventors: Takayuki Abe, Kanagawa (JP); Junji Sato, Tokyo (JP)

(73) Assignee: PANASONIC CORPORATION, Osaka (JP)

( * ) Notice: Subject to any disclaimer, the term of this patent is extended or adjusted under 35 U.S.C. 154(b) by 0 days.

(21) Appl. No.: 15/409,506

(22) Filed: Jan. 18, 2017

(65) Prior Publication Data

US 2017/0257067 A1  Sep. 7, 2017

(30) Foreign Application Priority Data

Mar. 7, 2016  (JP) .................. 2016-043312

(51) Int. Cl.
*H03F 1/02* (2006.01)
*H03F 3/21* (2006.01)
*H03F 3/193* (2006.01)
*H03F 3/45* (2006.01)

(52) U.S. Cl.
CPC ........... *H03F 1/0205* (2013.01); *H03F 3/193* (2013.01); *H03F 3/21* (2013.01); *H03F 2200/21* (2013.01); *H03F 2200/267* (2013.01); *H03F 2200/451* (2013.01)

(58) Field of Classification Search
USPC ......................................... 330/252–261, 311
See application file for complete search history.

(56) References Cited

U.S. PATENT DOCUMENTS

| 7,415,286 | B2 * | 8/2008 | Behzad ..................... H04B 1/18 330/252 |
| 7,639,079 | B2 * | 12/2009 | Chang ....................... H03F 1/08 330/260 |
| 9,413,309 | B1 * | 8/2016 | Zhao ........................ H03F 3/193 |
| 9,419,565 | B2 * | 8/2016 | Nobbe ...................... H03F 3/193 |
| 2012/0068769 | A1 | 3/2012 | Wang et al. |

FOREIGN PATENT DOCUMENTS

JP  2012-065168  3/2012

* cited by examiner

*Primary Examiner* — Hieu Nguyen
(74) *Attorney, Agent, or Firm* — Greenblum & Bernstein, P.L.C.

(57) ABSTRACT

A power amplifier circuit includes an input that receives a first input signal having a first phase and a second input signal having a second phase, a first transistor that includes a source that is supplied with a first voltage, and a gate that receives the first input signal, a second transistor that includes a source that is supplied with the first voltage, and a gate that receives the second input signal, a first neutralizing circuit that neutralizes a parasitic element, a second neutralizing circuit that neutralizes a parasitic element, N third transistors, N being an integer equal to or higher that 1, N fourth transistors, and an output that is connected between a drain of the N-th third transistor and a drain of the N-th fourth transistor and outputs a first output signal having a third phase and a second output signal having a fourth phase.

5 Claims, 9 Drawing Sheets

POWER AMPLIFIER CIRCUIT

BACKGROUND

1. Technical Field

The present disclosure relates to a power amplifier circuit.

2. Description of the Related Art

Availability of allocatable frequency bands is increasingly tight as radio technology, such as communications and radars, is in widespread use. To improve frequency availability, the use of high frequency bands, such as millimeter wavebands, has started. For example, a 60 GHz band has been used in the field of millimeter-wave communications and a 79 GHz band has been used in the field of millimeter-wave radars.

To ease the tight frequency availability, the use of a frequency band even higher than 100 GHz is expected. Radio apparatuses using a frequency band above 100 GHz are able to use a wider frequency range than the millimeter-wave radio apparatuses using the 60 GHz band or 79 GHz band, and may achieve high-speed communication and implement a high-resolution radar.

Radio integrated circuits (ICs) operating on a frequency above 100 GHz are expected to be manufactured at low costs as a frequency band above 100 GHz is going to be used.

Typically, radio ICs are manufactured of semiconductor through a complementary metal-oxide semiconductor (CMOS) process. The CMOS process allows a low-cost and highly integrated radio IC to be manufactured. Furthermore, through a miniaturization CMOS process, a transistor (radio IC) that is theoretically operable on a frequency above 100 GHz may be manufactured.

When a radio IC operating on a frequency above 100 GHz is manufactured through a miniaturization CMOS process, a margin permitted in designing a power amplifier circuit that is an element of the radio IC is small. High-gain techniques for the power amplifier circuit are being developed in order to operate a radio IC stably despite variations occurring in process, voltage, and temperature (PVT).

A maximum available gain (MAG) is contemplated as a parameter increasing a design margin in the power amplifier circuit. MAG of the power amplifier circuit is decreased by the effect of a parasitic element, such as a parasitic capacitance of a transistor.

Japanese Patent No. 5228017 discloses a power amplifier circuit that increases MAG. The power amplifier circuit neutralizes the effect of a parasitic capacitance Cgd between the gate and drain of a transistor.

Factors that decrease MAG of the power amplifier circuit includes, in addition to the parasitic capacitance Cgd, a parasitic capacitance Cgs between the gate and source of the transistor, and a parasitic capacitance Cds between the drain and source of the transistor. The parasitic capacitance Cgs and the parasitic capacitance Cds are created because the source of the transistor is not grounded by the effect of an inductance parasitic to the source of the transistor.

In the power amplifier circuit disclosed in Japanese Patent No. 5228017, the parasitic elements other than the parasitic capacitance Cgd are not sufficiently neutralized. There is still room for improvement in the decrease of MAG. Particularly, in a high frequency band near a maximum frequency (fmax) of the transistor, the effect of the parasitic elements is pronounced, and MAG of the power amplifier circuit decreases even more.

SUMMARY

One non-limiting and exemplary embodiment of the disclosure facilitates providing a power amplifier circuit that increases MAG in a high frequency band.

In one general aspect, the techniques disclosed here feature a power amplifier circuit including an input that receives a first input signal having a first phase and a second input signal having a second phase that is opposite to the first phase, a first transistor that includes a source that is supplied with a first voltage, and a gate that receives the first input signal from the input, a second transistor that includes a source that is supplied with the first voltage, and a gate that receives the second input signal from the input, a first neutralizing circuit that is connected between the gate of the second transistor and a drain of the first transistor and neutralizes a parasitic element, a second neutralizing circuit that is connected between the gate of the first transistor and a drain of the second transistor and neutralizes a parasitic element, N third transistors that are cascode-connected to the drain of the first transistor, N being an integer equal to or higher than 1, N fourth transistors that are cascode-connected to the drain of the second transistor, and an output that is connected to a drain of a N-th third transistor from among the N third transistors and a drain of a N-th fourth transistor from among the N fourth transistors and outputs a first output signal having a third phase and a second output signal having a fourth phase that is opposite to the third phase.

It should be noted that general or specific embodiments may be implemented as a system, a method, an integrated circuit, a computer program, a storage medium, or any selective combination thereof.

According to an aspect of the disclosure, the power amplifier circuit increases MAG in a high frequency band.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

An embodiment of the disclosure relates to a power amplifier circuit that operates on a high frequency above 100 GHz.

Figure 1:
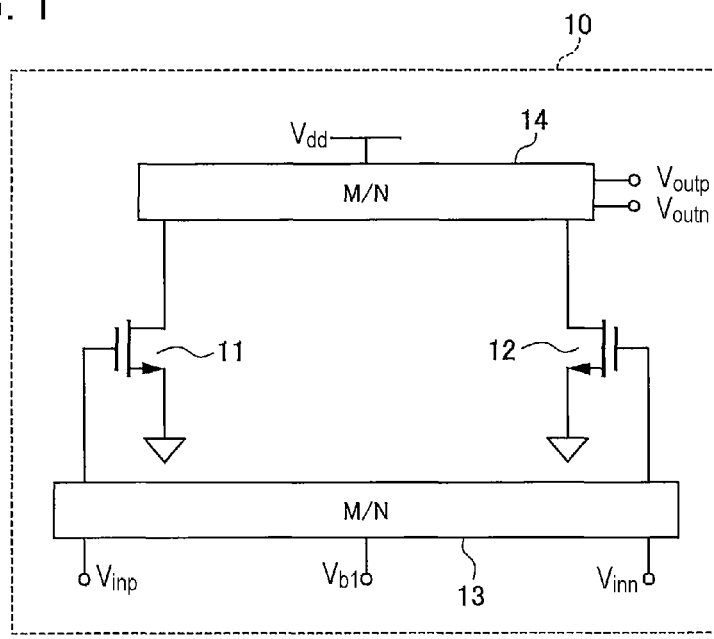
FIG. 1 is a circuit diagram of a power amplifier circuit of related art.

FIG. 1 is a circuit diagram of a power amplifier circuit 10 of related art. The power amplifier circuit 10 includes input transistors 11 and 12, an input circuit 13, and an output circuit 14. The input transistors 11 and 12 receive from the input circuit 13 input signals $V_{inp}$ and $V_{inn}$ which are mutually opposite in polarity. The output circuit 14 receives signals from the input transistors 11 and 12, and then outputs output signals $V_{outp}$ and $V_{outn}$ which are mutually opposite in polarity.

The input circuit 13 and the output circuit 14 are respectively connected to loads. When the input circuit 13 and the output circuit 14 are connected to the loads in conjugate matching, power gain of the power amplifier circuit 10 is maximized. The maximum power gain is referred to as a maximum available gain (MAG). Increasing MAG is useful in view of the design margin of the power amplifier circuit.

MAG of the power amplifier circuit 10 is expressed by formula (1) using Y parameters (Y21 and Y12), and a stability factor k:

$$MAG = |Y21/Y12| * \{k - (k^2-1)^{1/2}\} \quad (1)$$

Substituting Y parameters obtained from the equivalent circuit of the power amplifier circuit 10 for Y parameters in formula (1), formula (2) is obtained:

$$MAG = \frac{\{(\omega * Cgd)^2 + gm^2\}^{1/2}}{(\omega * |Cgd|)} * \{k - (k^2 - 1)^{1/2}\} \quad (2)$$

where ω is an angular frequency, gm is a transconductance of a transistor, and Cgd is a parasitic capacitance between the gate and drain of the transistor. As expressed in formula (2), Cgd is a factor that decreases MAG.

A power amplifier circuit of related art with a cross-coupling capacitor is available to control the decrease of MAG caused by the parasitic capacitance Cgd. MAG of the power amplifier circuit using the cross-coupling capacitor having a capacitance Cx is expressed by formula (3):

$$MAG = \frac{\{(\omega * (Cgd - Cx^2)) + gm^2\}^{1/2}}{(\omega * |Cgd - Cx|)} * \{k - (k^2 - 1)^{1/2}\} \quad (3)$$

It is appreciated that the use of the cross-coupling capacitor having a capacitance Cx nearly as high as the parasitic capacitance Cgd cancels the effect of the parasitic capacitance Cgd. In the discussion that follows, the cancellation of the parasitic element is referred to as neutralization of the parasitic element.

The power amplifier circuit includes a parasitic capacitance other than the parasitic capacitance Cgd, and that parasitic capacitance serves as a factor that decreases MAG. The power amplifier circuit having the cross-coupling capacitor alone is unable to sufficiently control the decrease of MAG.

Japanese Patent No. 5228017 discloses a power amplifier circuit that neutralizes a parasitic element to control the decrease of MAG caused by a parasitic element other than the parasitic capacitance Cgd. The power amplifier circuit of related art disclosed in Japanese Patent No. 5228017 is discussed with reference to FIG. 2.

Figure 2:
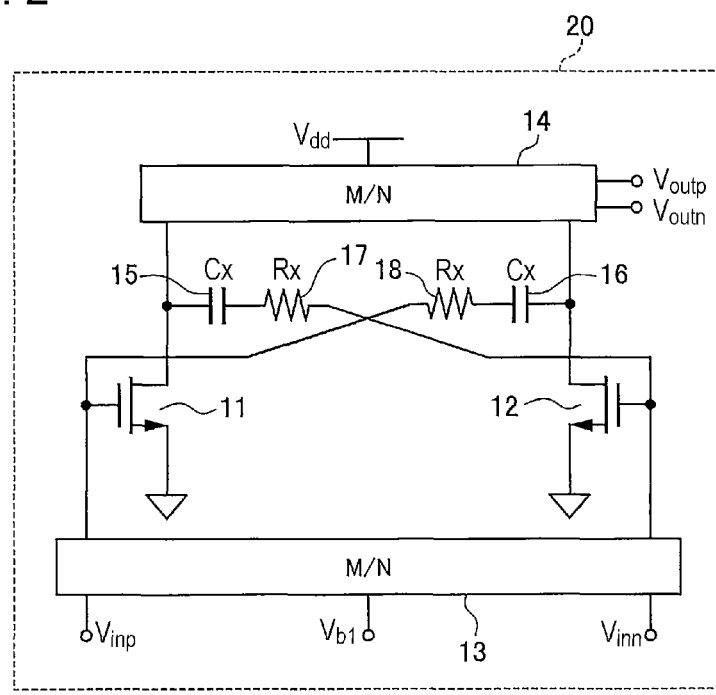
FIG. 2 is a circuit diagram of a power amplifier circuit of related art having a circuit that neutralizes a parasitic element.

FIG. 2 illustrates the power amplifier circuit 20 including a circuit that neutralizes the parasitic element. Referring to FIG. 2, elements identical to those of FIG. 1 are designated with the same reference numerals.

The power amplifier circuit 20 includes a cross-coupling capacitor 15 (having a capacitance Cx) and a resistor 17 (having a resistance Rx) connected in series between the drain of an input transistor 11 and the gate of an input transistor 12. The power amplifier circuit 20 also includes a cross-coupling capacitor 16 (having the capacitance Cx) and a resistor 18 (having the resistance Rx) connected in series between the drain of the input transistor 12 and the gate of the input transistor 11.

The power amplifier circuit 20 including the cross-coupling capacitors and the resistors neutralizes the parasitic capacitance Cgd and part of the parasitic elements other than the parasitic capacitance Cgd, and reduces the decrease of MAG in comparison with the power amplifier circuit having cross-coupling capacitors only.

Since the power amplifier circuit 20 of FIG. 2 disclosed in Japanese Patent No. 5228017 is unable to sufficiently neutralize the effect of parasitic elements present other than the parasitic capacitance Cgd, the improvement effect against the decrease of MAG is limited. In particular, in a high frequency band near a maximum oscillation frequency (fmax) of the transistor, MAG is decreased.

A parasitic capacitance (Cgs) between the gate and source of the transistor and a parasitic capacitance (Cds) between the drain and source of the transistor are contemplated as parasitic elements in addition to the parasitic capacitance Cgd. The parasitic capacitance Cgs and the parasitic capacitance Cds are created since the source of the transistor is not grounded by the effect of an inductance parasitic to the source of the transistor. The effect of the parasitic elements including these parasitic capacitances creates a feedback path to the output terminal of the transistor (drain terminal). The power amplifier circuit 20 disclosed in Japanese Patent No. 5228017 has difficulty in controlling the effect of the feedback path.

According to one aspect of the disclosure, in view of these circumstances, there is provided a power amplifier circuit that increases MAG in a high frequency band by reducing the effect of the feedback path to the drain terminal of the transistor.

Embodiments of the disclosure are described in detail with reference to the drawings. The embodiments are described below for exemplary purposes only, and the disclosure is not limited to the embodiments.

First Embodiment

Figure 3:
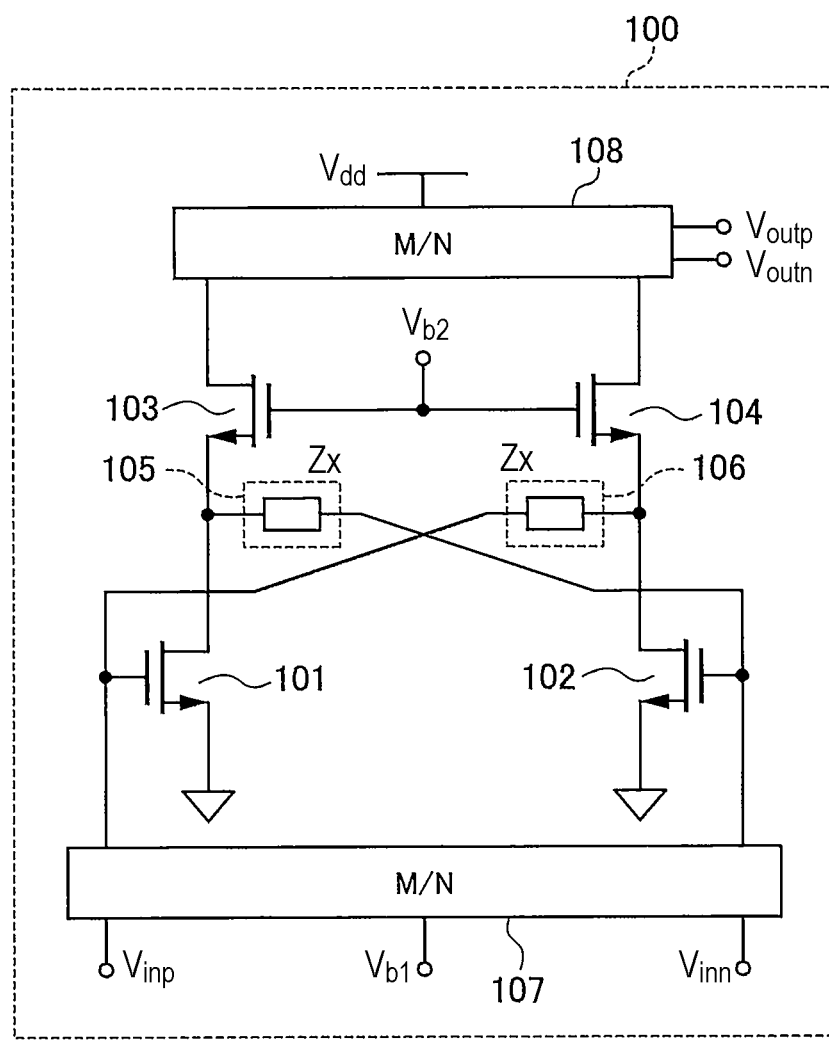
FIG. 3 is a circuit diagram of a power amplifier of a first embodiment of the disclosure.

FIG. 3 is a circuit diagram of a power amplifier circuit 100 of a first embodiment of the disclosure. The power amplifier circuit 100 includes input transistors 101 and 102, cascode transistors 103 and 104, neutralizing circuits 105 and 106, an input circuit 107, and an output circuit 108.

The input circuit 107 is supplied with a voltage $V_{b1}$, an input signal $V_{inp}$ having a positive phase (first phase) and an input signal $V_{inn}$ having a negative phase (second phase that is opposite to the first phase). The input circuit 107 performs a matching operation between the positive phase input signal $V_{inp}$ and the negative phase input signal $V_{inn}$.

The gate of the input transistor 101 (first transistor), connected to the input circuit 107, is supplied with the positive phase input signal $V_{inp}$ from the input circuit 107. The source of the input transistor 101 is connected to ground (GND). The source of the input transistor 101 is supplied with a 0 V (first voltage). The source of the input transistor 101 may be connected to a power source that supplies a voltage other than 0 V.

The gate of the input transistor 102 (second transistor), connected to the input circuit 107, is supplied with the negative phase input signal $V_{inn}$ from the input circuit 107. The source of the input transistor 102 is connected to ground. The source of the input transistor 102 is supplied with a 0 V (first voltage). The source of the input transistor 102 may be connected to a power source that supplies a voltage other than 0 V. The input circuit 107 supplies a voltage $V_{b1}$ to the gate of each of the input transistors 101 and 102.

The neutralizing circuits 105 and 106 neutralize parasitic elements in the power amplifier circuit 100, and each of the neutralizing circuits 105 and 106 has an impedance value Zx. The parasitic elements include a parasitic element of the input transistor 101 and a parasitic element of the input transistor 102. The neutralizing circuit 105 (first neutralizing circuit) is connected between the drain of the input transistor 101 and the gate of the input transistor 102, and neutralizes the parasitic element. The neutralizing circuit 106 (second neutralizing circuit) is connected between the drain of the input transistor 102 and the gate of the input transistor 101, and neutralizes the parasitic element. The configuration of the neutralizing circuits 105 and 106 is described below.

The cascode transistor 103 (third transistor) is connected to the drain of the input transistor 101 in a vertical fashion (cascode fashion). More specifically, the source of the cascode transistor 103 is connected to the drain of the input transistor 101. The drain of the cascode transistor 103 is connected to the output circuit 108.

The cascode transistor 104 (fourth transistor) is connected to the drain of the input transistor 102 in the vertical fashion (cascode fashion). More specifically, the source of the cascode transistor 104 is connected to the drain of the input transistor 102. The drain of the cascode transistor 104 is connected to the output circuit 108.

The cascode transistor 103 is paired with the cascode transistor 104. The gate of the cascode transistor 103 is connected to the gate of the cascode transistor 104. The gate of the cascode transistor 103 and the gate of the cascode transistor 104 are supplied with a bias voltage $V_{b2}$.

The gate of the cascode transistor 103 does not necessarily have to be connected to the gate of the cascode transistor 104.

The output circuit 108 supplies a voltage $V_{dd}$ to the drains of the cascode transistors 103 and 104. The output circuit 108 receives outputs from the cascode transistors 103 and 104, and then outputs an output signal $V_{outp}$ (first output signal) having a positive phase (third phase) and an output signal $V_{outn}$ (second output signal) having a negative phase (fourth phase that is opposite to the third phase).

The configurations of the neutralizing circuits 105 and 106 are described with reference to FIG. 4 and FIG. 5.

Figure 4:
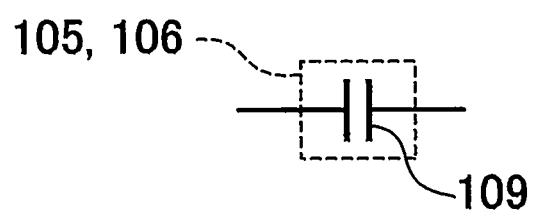
FIG. 4 illustrates a first configuration of neutralizing circuits of the first embodiment of the disclosure.

FIG. 4 illustrates a first configuration of the neutralizing circuits 105 and 106 of the first embodiment. Referring to FIG. 4, each of the neutralizing circuits 105 and 106 has a capacitor 109.

The capacitor 109 may be a capacitor having a fixed capacitance, such as a metal-insulator-metal (MIM) capacitor or a metal-oxide-metal (MOM) capacitor or may be a capacitor having a variable capacitance, which includes a combination of an MIM capacitor, an MOM capacitor, and a switch disposed on an array. The capacitor 109 may also be a variable capacitor, such as a metal-oxide-semiconductor (MOS) capacitor.

Since each of the neutralizing circuits 105 and 106 includes the capacitor 109 alone in the configuration of FIG. 4, the circuit layout thereof is easy, and the area for the circuit is minimized. When the capacitor 109 is a fixed small capacitance capacitor, such a small capacitance capacitor may be easily formed in the circuit. When the capacitor 109 is a variable capacitance capacitor, the calibration thereof is possible after manufacturing.

Figure 5:
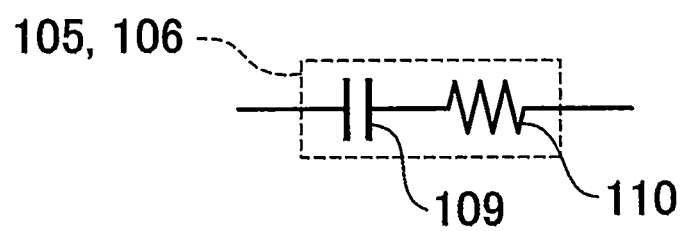
FIG. 5 illustrates a second configuration of the neutralizing circuits of the first embodiment of the disclosure.

FIG. 5 illustrates a second configuration of the neutralizing circuits 105 and 106 of the first embodiment. Referring to FIG. 5, each of the neutralizing circuits 105 and 106 includes a capacitor 109 and a resistor 110 connected in series with the capacitor 109.

As in the configuration illustrated in FIG. 4, the capacitor 109 may be a variable or fixed capacitance capacitor. The resistor 110 may be a fixed or variable resistance resistor.

Since each of the neutralizing circuits 105 and 106 includes the resistor 110, isolation characteristics improve in the configuration of FIG. 5. MAG may be further increased. When the resistor 110 is a fixed resistance resistor, a small resistance resistor may be easily formed. When the resistor 110 is a variable resistance resistor, the calibration thereof is possible after manufacturing.

MAG characteristics of the power amplifier circuit 100 of the first embodiment are described with reference to FIG. 6.

Figure 6:
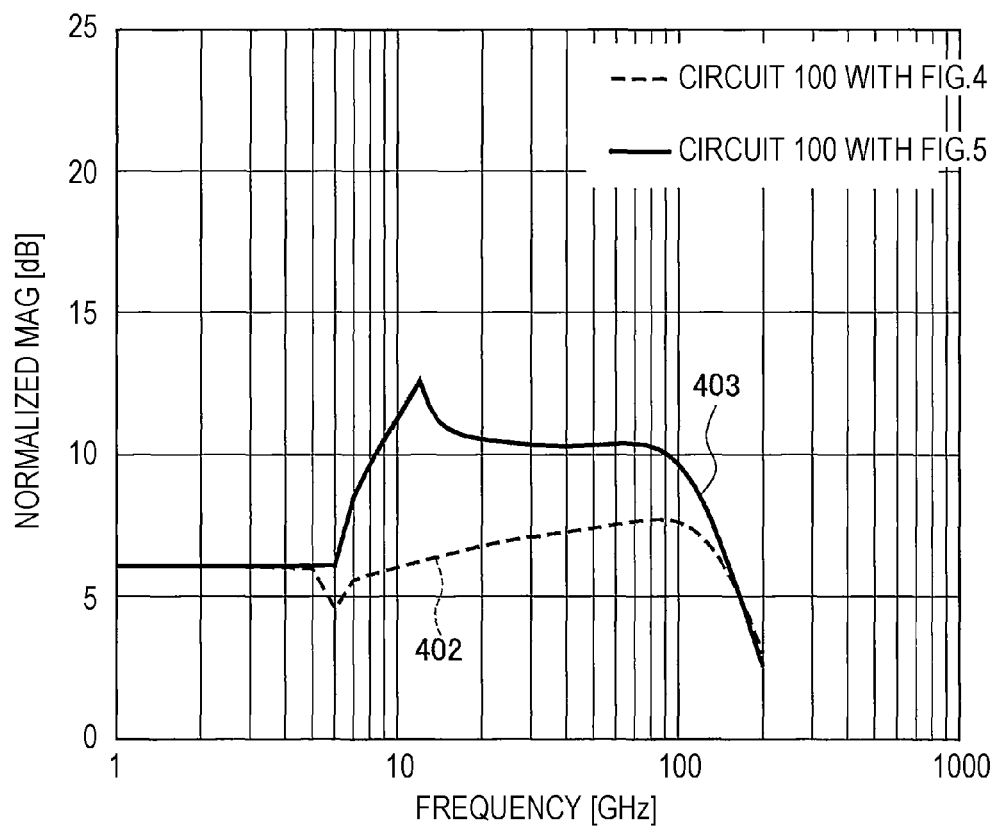
FIG. 6 illustrates MAG characteristics of the power amplifier circuit of the first embodiment of the disclosure.

FIG. 6 illustrates the MAG characteristics of the power amplifier circuit 100 of the first embodiment. The abscissa in FIG. 6 represents frequency. The ordinate in FIG. 6 represents decibel (dB) MAG values of the power amplifier circuit 100 that are normalized by MAG values of the power amplifier circuit 20 of related art illustrated in FIG. 2 (normalized MAG). When the normalized dB MAG value is higher than 0 along the ordinate in FIG. 6, the MAG value is higher than the MAG value of the power amplifier circuit 20 of related art.

Referring to FIG. 6, a characteristic 402 is the characteristic of the power amplifier circuit 100 including the neutralizing circuits 105 and 106 having the configuration of FIG. 4. A characteristic 403 is the characteristic of the power amplifier circuit 100 including the neutralizing circuits 105 and 106 having the configuration of FIG. 5.

Referring to FIG. 6, the characteristic 402 and the characteristic 403 have values higher than 0 dB. The power amplifier circuit 100 of the first embodiment has significant improvement in the MAG value in comparison with the power amplifier circuit 20 of related art illustrated in FIG. 2.

As described above, the power amplifier circuit 100 of the first embodiment includes the neutralizing circuits 105 and 106 neutralizing the parasitic elements of the input transistors 101 and 102, and the cascode transistors 103 and 104 respectively cascode-connected to the input transistors 101 and 102. The use of the neutralizing circuits 105 and 106 limits the feedback paths from the drains of the input transistors 101 and 102 to the gates of the input transistors 101 and 102 to paths via the parasitic capacitance Cds between the drain and source of each of the input transistors 101 and 102 and the parasitic capacitance Cgs between the source and gate of each of the input transistors 101 and 102. By cascode-connecting the cascode transistors 103 and 104 with the input transistors 101 and 102, isolation characteristics in a frequency band as low as several tens of GHz or lower improve.

In a frequency band higher than several tens of GHz, the parasitic capacitance between the drain of each of the cascode transistors 103 and 104 connected to the output circuit 108 and the source of the corresponding one of the cascode transistors 103 and 104 is serially connected to the parasitic capacitance of each of the input transistors 101 and 102 limited by the neutralizing circuits 105 and 106. More specifically, in the power amplifier circuit 100 of the first embodiment, parasitic capacitances between the input circuit 107 and the output circuit 108 are reduced more by serially connecting parasitic capacitances than in the configuration where the cascode transistors 103 and 104 are not used. A cooperation effect between the neutralizing circuits 105 and 106 and the cascode transistors 103 and 104 improves the isolation characteristics in the high frequency band, thereby increasing the MAG value.

The configuration of the first embodiment includes the single cascode transistor 103 cascode-connected to the drain of the input transistor 101 and the single cascode transistor 104 cascode-connected to the drain of the input transistor 102. The disclosure is not limited to this configuration. In another configuration, N cascode transistors (third transistors) may be cascode-connected to the drain of the input transistor 101 (N is an integer equal to or higher than 2), and N cascode transistors (fourth transistors) may be cascode connected to the drain of the input transistor 102. In that configuration, the N cascode transistors cascode-connected to the input transistor 101 are respectively paired with the N cascode transistors cascode-connected to the input transistor 102.

In that configuration, the N cascode transistors cascode-connected to the drain of the input transistor 101 are referred to as a first cascode transistor, a second cascode transistor, . . . , an N-th cascode transistor in the order of closeness to the drain of the input transistor 101. The drain of the N-th cascode transistor (N-th third transistor) is connected to the output circuit 108.

In that configuration, as well, the gates of the N cascode transistors cascode-connected to the input transistor 101 are respectively supplied with N different bias voltages, and the gates of the N cascode transistors cascode-connected to the input transistor 102 are respectively supplied with N different bias voltages. The gate of the cascode transistor cascode-connected to the input transistor 101 and the gate of the cascode transistor cascode-connected to the input transistor 102 paired with that input transistor 101 are supplied with the same bias voltage.

Second Embodiment

Figure 7:
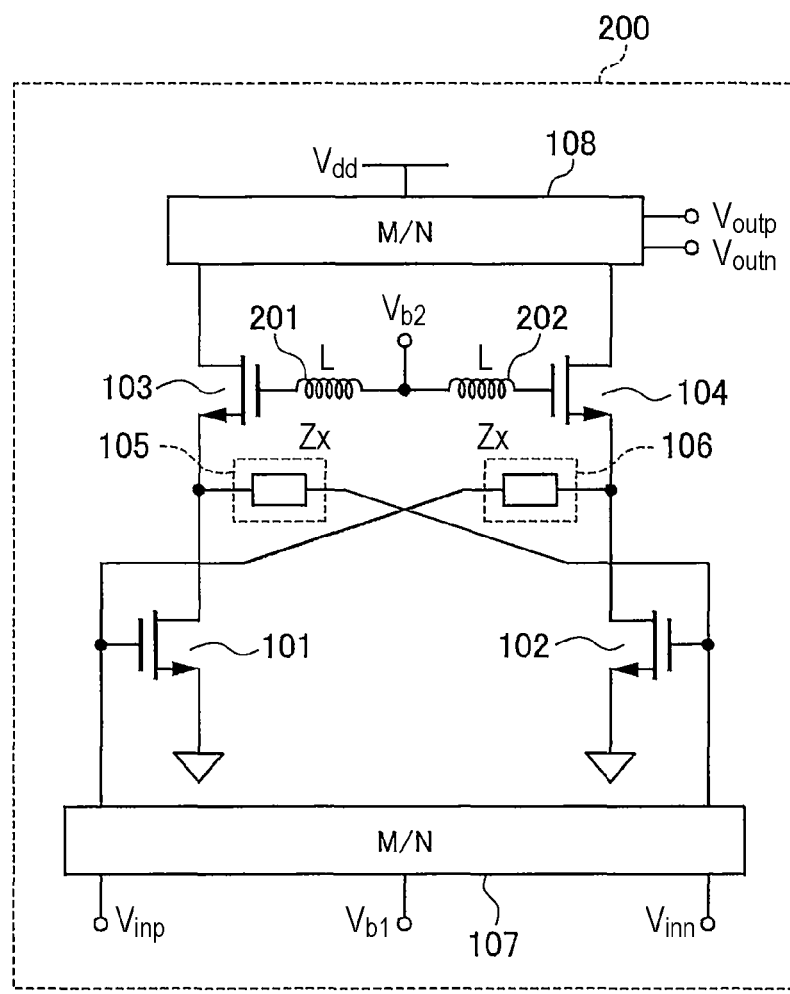
FIG. 7 is a circuit diagram of a power amplifier circuit of a second embodiment of the disclosure.

FIG. 7 is a circuit diagram of a power amplifier circuit 200 of a second embodiment of the disclosure. Referring to FIG. 7, elements identical to those illustrated in FIG. 3 are designated with the same reference numerals and the discussion thereof is omitted.

The power amplifier circuit 200 of FIG. 7 is identical to the power amplifier circuit 100 of FIG. 3 but includes inductors 201 and 202.

A first terminal of the inductor 201 (first inductor) is connected to the gate of the cascode transistor 103. The bias voltage $V_{b2}$ is supplied to a second terminal of the inductor 201. A first terminal of the inductor 202 (second inductor) is connected to the gate of the cascode transistor 104. The bias voltage $V_{b2}$ is supplied to a second terminal of the inductor 202. Each of the inductors 201 and 202 has an inductance value L.

The MAG characteristics of the power amplifier circuit 200 of the second embodiment are described with reference to FIG. 8.

Figure 8:
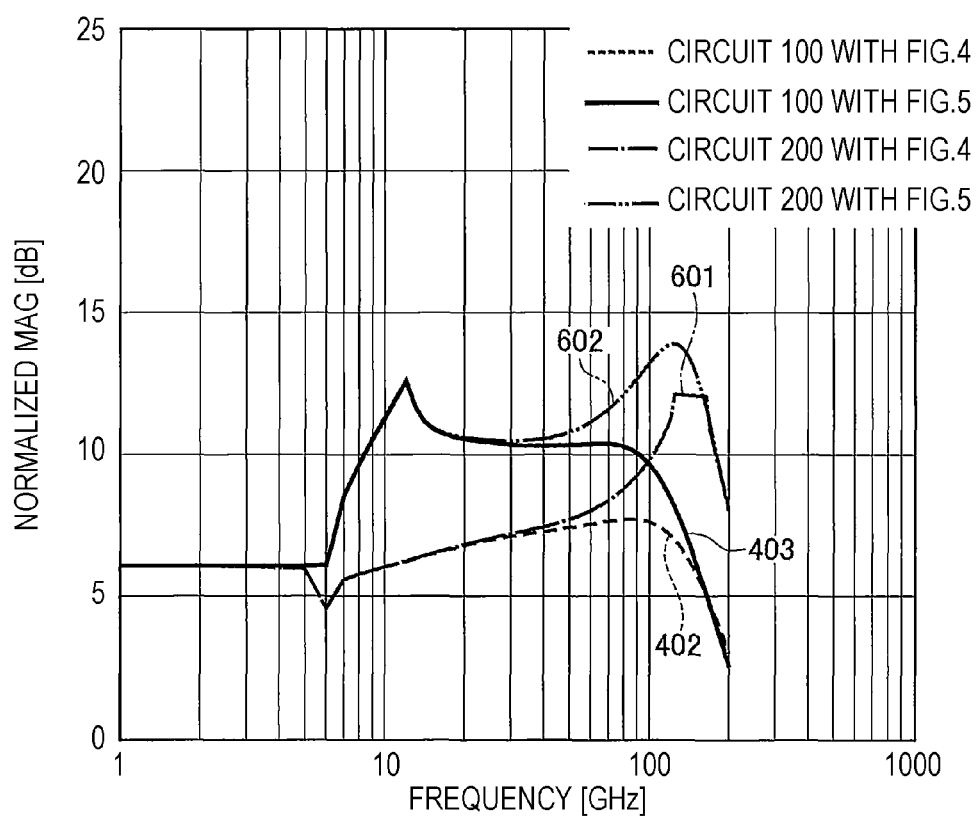
FIG. 8 illustrates MAG characteristics of the power amplifier circuit of the second embodiment of the disclosure.

FIG. 8 illustrates the MAG characteristics of the power amplifier circuit 200 of the second embodiment. In FIG. 8 as well as FIG. 6, the ordinate represents normalized MAG and the abscissa represents frequency. A characteristic 601 is the characteristic of the power amplifier circuit 200 including the neutralizing circuits 105 and 106 having the configuration of FIG. 4. A characteristic 602 is the characteristic of the power amplifier circuit 200 including the neutralizing circuits 105 and 106 having the configuration of FIG. 5. FIG. 8 also illustrates the characteristics 402 and 403 of FIG. 6 for comparison purposes.

Referring to FIG. 8, each of the characteristic 601 and the characteristic 602 has a value higher than 0 dB. In other words, the power amplifier circuit 200 of the second embodiment has significant improvement in the MAG value in comparison with the power amplifier circuit 20 of related art illustrated in FIG. 2. The characteristics 601 and 602 are still higher in the MAG value than the characteristics 402 and 403. The power amplifier circuit 200 of the second embodiment has an MAG improvement over the power amplifier circuit 100 of the first embodiment.

As described above, in the power amplifier circuit 200 of the second embodiment, the inductors 201 and 202 are added to the configuration of the power amplifier circuit 100 of the first embodiment, and the cascode transistors 103 and 104 in pairs generate signals different in phase. The power amplifier circuit 200 of the second embodiment thus increases the MAG value in a particular frequency range. More specifically, the power amplifier circuit 200 of the second embodiment increases the MAG value in the vicinity of a resonant frequency between the inductor and the parasitic capacitance of the cascode transistor. For example, the characteristic 601 and characteristic 602 of FIG. 8 indicate that the MAG value increases in a frequency range near or above 100 GHz.

The inductors 201 and 202 respectively connected to the gates of the cascode transistors 103 and 104 may be electromagnetically coupled with each other such that the signals (the bias voltages $V_{b2}$ of FIG. 7) supplied to the gates cause the cascode transistors 103 and 104 to output signals in mutually opposite phases. This configuration increases an effective inductance of each of the inductors 201 and 202 by a mutual inductance in comparison with the case in which the inductors 201 and 202 are individually used. For this reason, the area for the inductors is reduced in the entire area of the whole circuit.

The inductors 201 and 202 respectively connected to the gates of the cascode transistors 103 and 104 may be electromagnetically coupled with each other such that the signals applied to the gates cause the cascode transistors 103 and 104 to output signals in phase. This configuration lowers an effective inductance by a mutual inductance in comparison with the case in which the inductors 201 and 202 are individually used. Since inductance is created in wiring in a power amplifier circuit operating in a high frequency band, a change in the whole circuit layout by extending the wiring is difficult. The configuration in which the inductors 201 and 202 are replaced with a transformer allows the wiring to extend by a length responsive to an effective inductance reduction, and freedom in the whole circuit layout is thus increased.

The magnetically coupled configuration that the signals applied to the gates cause the cascode transistors to output the signals in phase or in mutually opposite phase provides MAG characteristics similar to those illustrated in FIG. 8.

Third Embodiment

Figure 9:
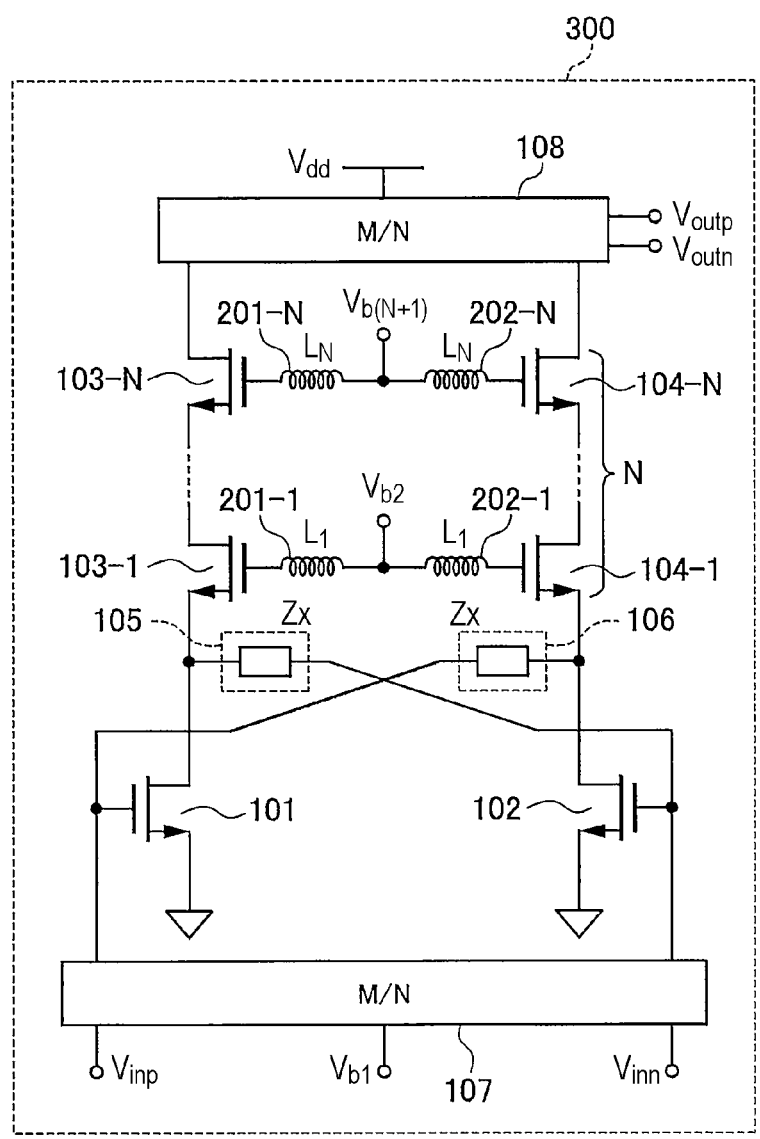
FIG. 9 is a circuit diagram of a power amplifier circuit of a third embodiment of the disclosure.

FIG. 9 is a circuit diagram of a power amplifier circuit 300 of a third embodiment of the disclosure. In FIG. 9, elements identical to those of FIG. 7 are designated with the same reference numerals, and the discussion thereof is omitted herein.

The power amplifier circuit 300 of FIG. 9 is identical to the configuration of the power amplifier circuit 200 of FIG. 7, but includes cascode-connected N cascode transistors 103 and N cascode transistors 104, and N inductors 201 and N inductors 202 respectively connected to the N cascode transistors 103 and the N cascode transistors 104.

More specifically, in the power amplifier circuit 300, the N cascode transistors 103-1 through 103-N are cascode-connected to the drain of the input transistor 101. Similarly, N cascode transistors 104-1 through 104-N are cascode-connected to the drain of the input transistor 102. First terminals of the inductors 201-1 through 201-N are respectively connected to the gates of the cascode transistors 103-1 through 103-N. First terminals of the inductors 202-1 through 202-N are respectively connected to the gates of the cascode transistors 104-1 through 104-N. N different bias voltages $V_{b2}$ through $V_{b(N+1)}$ are respectively supplied to second terminals of the inductors 201-1 through 201-N. Similarly, the N different bias voltages $V_{b2}$ through $V_{b(N+1)}$ are respectively supplied to second terminals of the inductors 202-1 through 202-N. The drain of the cascode transistor 103-N (N-th third transistor) and the drain of the cascode transistor 104-N (N-th fourth transistor) are connected to the output circuit 108.

In this configuration, the bias voltage $V_{b(i+1)}$ (i-th bias voltage) from among the N different bias voltages $V_{b2}$ through $V_{b(N+1)}$ is supplied to the gate of the cascode transistor 103-i (i-th third transistor) via the inductor 201-i (i is an integer within a range of 1 to N). Similarly, the bias voltage $V_{b(i+1)}$ (i-th bias voltage) from among the N different bias voltages $V_{b2}$ through $V_{b(N+1)}$ is also supplied to the gate of the cascode transistor 104-i (i-th fourth transistor) paired with the cascode transistor 103-i via the inductor 202-i.

The MAG characteristics of the power amplifier circuit 300 of the third embodiment are described with reference to FIG. 10.

Figure 10:
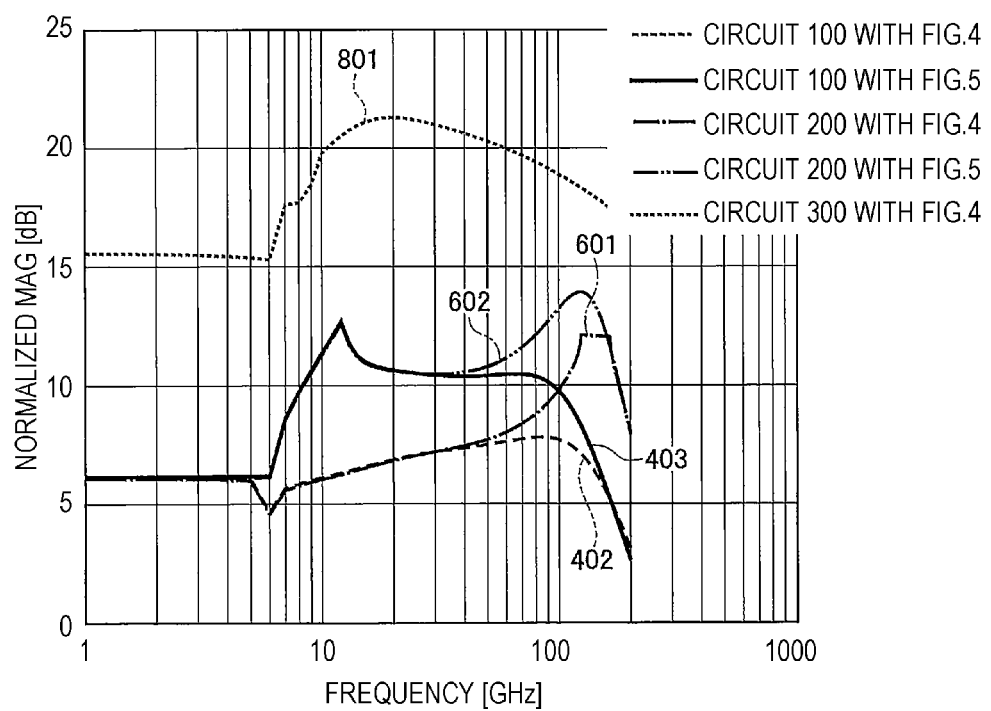
FIG. 10 illustrates MAG characteristics of the power amplifier of the third embodiment of the disclosure.

FIG. 10 illustrates the MAG characteristics of the power amplifier circuit 300 of the third embodiment of the disclosure. In FIG. 10 as well as FIG. 6, the ordinate represents normalized MAG and the abscissa represents frequency. A characteristic 801 is the characteristic of the power amplifier circuit 300 including the neutralizing circuits 105 and 106 having the configuration of FIG. 4. FIG. 10 also illustrates the characteristics 402 and 403 of FIG. 6, and the characteristics 601 and 602 of FIG. 8 for comparison purposes.

Referring to FIG. 10, the characteristic 801 has a value higher than 0 dB. In other words, the power amplifier circuit 300 of the third embodiment has significant improvement in the MAG value in comparison with the power amplifier circuit 20 of related art illustrated in FIG. 2. The characteristic 801 is still higher in the MAG value than each of the characteristic 402, the characteristic 403, the characteristic 601, and the characteristic 602. The power amplifier circuit 300 of the third embodiment has an MAG improvement over the power amplifier circuit 100 of the first embodiment, and the power amplifier circuit 200 of the second embodiment.

FIG. 10 illustrates the characteristics of the power amplifier circuit 300 including the neutralizing circuits 105 and 106 having the configuration of FIG. 4. The power amplifier circuit 300 may include the neutralizing circuits 105 and 106 having the configuration of FIG. 5. In that configuration, as well, an increased MAG value results.

By cascode-connecting the multiple cascode transistors, each transistor having an inductor connected thereto in the power amplifier circuit 300 of the third embodiment as described above, a high impedance results in comparison with the power amplifier having a single stage of cascode transistors. The power amplifier circuit 300 of the third embodiment improves the isolation characteristics, and also increases the MAG value.

In accordance with the third embodiment, an inductor is connected to each of all the cascode transistors 103-1 through 103-N and all the cascode transistors 104-1 through 104-N. The disclosure is not limited to this configuration. From among the cascode transistors 103-1 through 103-N cascode-connected to the input transistor 101, inductors may be respectively connected to K cascode transistors 103 (K is an integer within a range from 1 to N). In such a case, from among the cascode transistors 104-1 through 104-N cascode-connected to the input transistor 102, inductors are also respectively connected K cascode transistors 104 (K is an integer within a range from 1 to N). The K cascode transistors 103 are respectively paired with the K cascode transistors 104. By reducing the number of connected inductors, the circuit layout area is reduced.

All or some of the inductors 201-1 through 201-N respectively connected to the cascode transistors 103-1 through 103-N may be electromagnetically coupled with all or some of the inductors 202-1 through 202-N respectively connected to the cascode transistors 104-1 through 104-N such that the signals applied to the gates causes the corresponding cascode transistors to output signals in opposite phase. Since this configuration increases an effective inductance by a mutual inductance in comparison with the case in which the inductors are individually used, the area for the inductors is reduced. As described above, the inductors are electromagnetically coupled with each other such that the signals applied to the gates of the paired cascode transistors causes the paired cascode transistors to output signals in mutually opposite phase. These inductors are inductors (the inductor 201-i and the inductor 202-i) connected between the paired cascode transistors (namely, the cascode transistor 103-i and the cascode transistor 104-i) (i is an integer within a range from 1 to N).

The inductors 201 and 202 respectively connected to the gates of the cascode transistors 103 and 104 may be electromagnetically coupled with each other such that the signals applied to the gates of the paired cascode transistors causes the paired cascode transistors to output signals in phase. Since this configuration lowers an effective inductance by a mutual inductance in comparison with the case in which the inductances are individually used, freedom in the whole circuit layout is increased. As described above, the inductors are electromagnetically coupled with each other such that the signals applied to the gates of the paired cascode transistors causes the paired cascode transistors to output signals in phase. These inductors are inductors (the inductors 201-i and the inductor 202-i) connected between the paired cascode transistors (namely, the cascode transistor 103-i and the cascode transistor 104-i) (i is an integer within a range from 1 to N).

Fourth Embodiment

In accordance with the third embodiment, the multiple stages of transistors are cascode-connected. With the multiple stages of transistors cascode-connected, a voltage above the withstand voltage of the cascode transistor may be supplied and a cascode transistor may break down. In accordance with a fourth embodiment, the voltage at the source of a cascode transistor is adjusted by adjusting a bias voltage supplied to the gate of the cascode transistor, and a voltage supplied to the cascode transistor is thus controlled to a desired voltage.

Figure 11:
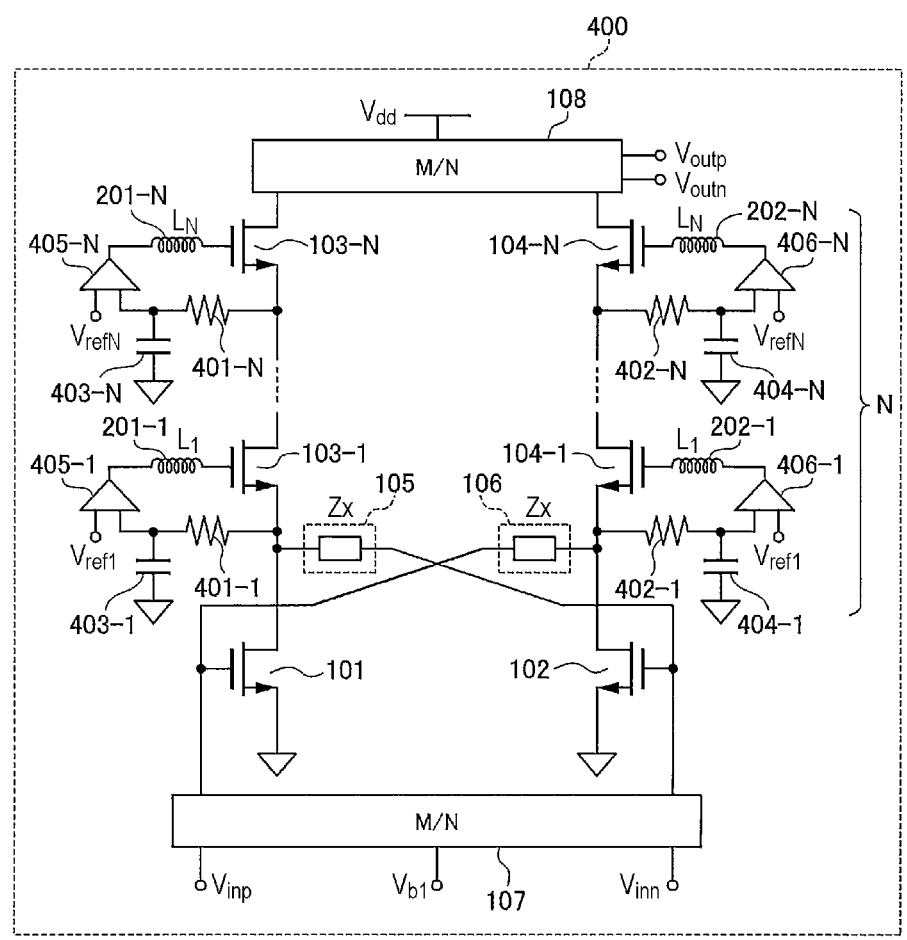
FIG. 11 is a circuit diagram of a power amplifier circuit of a fourth embodiment of the disclosure.

FIG. 11 is a circuit diagram of a power amplifier circuit 400 of the fourth embodiment of the disclosure. In FIG. 11, elements identical to those illustrated in FIG. 9 are designated with the same reference numerals, and the discussion thereof is omitted.

The power amplifier circuit 400 of FIG. 11 is different from the power amplifier circuit 300 of FIG. 9 in the configuration that supplies a bias voltage to each of the cascode transistors 103-1 through 103-N and the cascode transistors 104-1 through 104-N. As an example, the configuration that supplies the bias voltage to the cascode transistor 103-1 is described below.

The gate of the cascode transistor 103-1 is connected to a first terminal of the inductor 201-1 in a way similar to the configuration of the power amplifier circuit 300 of FIG. 9. A resistor 401-1 and a comparator 405-1 are connected between a second terminal of the inductor 201-1 and the source of the cascode transistor 103-1.

The comparator 405-1 includes a first input terminal, a second input terminal, and an output terminal. The resistor 401-1 is connected between the first input terminal of the comparator 405-1 and the source of the cascode transistor 103-1. A capacitor 403-1 includes a first connection terminal and a second connection terminal, with the first connection terminal connected to the first input terminal of the comparator 405-1 and the second connection terminal grounded. The second connection terminal of the capacitor 403-1 is supplied with a 0 V voltage (first voltage). The second input terminal of the comparator 405-1 is supplied with a reference voltage $V_{ref1}$. The second connection terminal of the capacitor 403-1 may be connected to a power source that supplies a voltage other than 0 V (first voltage).

The comparator 405-1 compares the reference voltage $V_{ref1}$ with a source-ground voltage of the cascode transistor 103-1 supplied via the resistor 401-1 and the capacitor 403-1, and controls the bias voltage supplied to the gate of the cascode transistor 103-1 such that the source-ground voltage of the cascode transistor 103-1 is equal to the reference voltage $V_{ref1}$.

When the second connection terminal of the capacitor 403-1 is connected to the power source that supplies a voltage other than 0 V (first voltage), the comparator 405-1 compares the reference voltage $V_{ref}$ with a difference between the first voltage and the voltage at the source of the cascode transistor 103-1 acquired via the resistor 401-1 and the capacitor 403-1, and controls the bias voltage supplied to the gate of the cascode transistor 103-1 such that the difference between the first voltage and the voltage at the source of the cascode transistor 103-1 is the reference voltage $V_{ref1}$.

The configuration to supply the bias voltage to each of the cascode transistors 103-2 through 103-N is identical to the configuration to supply the bias voltage to the cascode transistor 103-1. The configuration to supply the bias voltage to each of the cascode transistors 104-1 through 104-N is identical to the configuration to supply the bias voltage to the cascode transistor 103-1 by connecting the resistors 402-1 through 402-N, the capacitors 404-1 through 404-N, and the comparators 406-1 through 406-N.

In accordance with the fourth embodiment, as described above, the comparator controls the bias voltage supplied to the gate of the cascode transistor such that the source voltage of the cascode transistor is equal to the reference voltage. The bias voltage is thus controlled to be below the withstand voltage of the transistor despite variations in the characteristics of the cascode transistor caused through the miniature CMOS process. Reliability of the miniature CMOS process is thus improved.

The fourth embodiment provides MAG improvement in the same way as described with reference to the third embodiment.

In accordance with the fourth embodiment, an inductor and a circuit to supply the bias voltage via the inductor are respectively connected to each of all the cascode transistors 103-1 through 103-N and the cascode transistors 104-1 through 104-N. The disclosure is not limited to this configuration. From among the cascode transistors 103-1 through 103-N cascode-connected to the input transistor 101, inductors may be respectively connected to K cascode transistors 103 (K is an integer within a range from 1 to N). In such a case, from among the cascode transistors 104-1 through 104-N cascode-connected to the input transistor 102, inductors are also respectively connected to K cascode transistors 104 (K is an integer within a range from 1 to N). The K cascode transistors 103 are respectively paired with the K cascode transistors 104. The circuit to supply the bias voltage as described with reference to the fourth embodiment may be connected to at least one cascode transistor from among the K cascode transistors 103. The circuit layout area is reduced by reducing the number of inductors and the number of circuits to apply the bias voltage.

In accordance with the fourth embodiment, the bias voltage is supplied to the gate of each of the cascode transistors 103-1 through 103-N and the cascode transistors 104-1 through 104-N that are connected to the inductors. The disclosure is not limited to this configuration. The circuit to supply the bias voltage described with reference to the fourth embodiment may be applied to a circuit that does not include an inductor.

The power amplifier circuit of the disclosure finds applications in high-resolution radars and high-speed communications, which are expected to operate above 100 GHz.

What is claimed is:

1. A power amplifier, comprising:
   an input that receives a first input signal having a first phase and a second input signal having a second phase that is opposite to the first phase;
   a first transistor that includes a source that is supplied with a first voltage, and a gate that receives the first input signal from the input;
   a second transistor that includes a source that is supplied with the first voltage, and a gate that receives the second input signal from the input;
   a first neutralizer that is connected between the gate of the second transistor and a drain of the first transistor and neutralizes a parasitic element;
   a second neutralizer that is connected between the gate of the first transistor and a drain of the second transistor and neutralizes a parasitic element;
   N third transistors that are cascode-connected to the drain of the first transistor, N being an integer more than 1 and N different bias voltages being respectively supplied to the N third transistors;
   N fourth transistors that are cascode-connected to the drain of the second transistor, the N different bias voltages being respectively supplied to the N fourth transistors; and
   an output that is connected to a drain of an N-th third transistor from among the N third transistors and a drain of an N-th fourth transistor from among the N fourth transistors and outputs a first output signal having a third phase and a second output signal having a fourth phase that is opposite to the third phase.

2. The power amplifier according to claim 1, wherein each of the first neutralizer and the second neutralizer comprises a capacitor.

3. The power amplifier according to claim 2, wherein each of the first neutralizer and the second neutralizer comprises a resistor connected in series with the capacitor.

4. A power amplifier, comprising:
an input that receives a first input signal having a first phase and a second input signal having a second phase that is opposite to the first phase;
a first transistor that includes a source that is supplied with a first voltage, and a gate that receives the first input signal from the input;
a second transistor that includes a source that is supplied with the first voltage, and a gate that receives the second input signal from the input;
a first neutralizer that is connected between the gate of the second transistor and a drain of the first transistor and neutralizes a parasitic element;
a second neutralizer that is connected between the gate of the first transistor and a drain of the second transistor and neutralizes a parasitic element;
N third transistors that are cascode-connected to the drain of the first transistor, N being an integer equal to or higher than 1;
N fourth transistors that are cascode-connected to the drain of the second transistor; and
an output that is connected to a drain of an N-th third transistor from among the N third transistors and a drain of an N-th fourth transistor from among the N fourth transistors and outputs a first output signal having a third phase and a second output signal having a fourth phase that is opposite to the third phase;
N first inductors that are respectively connected to the N third transistors; and
N second inductors that are respectively connected to the N fourth transistors,
wherein
a gate of an i-th third transistor from among the N third transistors is supplied with an i-th bias voltage, from among N different bias voltages, i being an integer within a range from 1 to N;
a gate of an i-th fourth transistor paired with the i-th third transistor, from among the N fourth transistors, is supplied with the i-th bias voltage;
a first terminal of an i-th first inductor from among the N first inductors is connected to the gate of the i-th third transistor and a second terminal of the i-th first inductor is supplied with the i-th bias voltage; and
a first terminal of an i-th second inductor from among the N second inductors is connected to the gate of the i-th fourth transistor and a second terminal of the i-th second inductor is supplied with the i-th bias voltage.

5. A power amplifier, comprising:
an input that receives a first input signal having a first phase and a second input signal having a second phase that is opposite to the first phase;
a first transistor that includes a source that is supplied with a first voltage, and a gate that receives the first input signal from the input;
a second transistor that includes a source that is supplied with the first voltage, and a gate that receives the second input signal from the input;
a first neutralizer that is connected between the gate of the second transistor and a drain of the first transistor and neutralizes a parasitic element;
a second neutralizer that is connected between the gate of the first transistor and a drain of the second transistor and neutralizes a parasitic element;
N third transistors that are cascode-connected to the drain of the first transistor, N being an integer equal to or higher than 1;
N fourth transistors that are cascode-connected to the drain of the second transistor; and
an output that is connected to a drain of an N-th third transistor from among the N third transistors and a drain of an N-th fourth transistor from among the N fourth transistors and outputs a first output signal having a third phase and a second output signal having a fourth phase that is opposite to the third phase,
wherein a gate of an i-th third transistor from among the N third transistors is supplied with an i-th bias voltage from among N different bias voltages, i being an integer within a range from 1 to N,
wherein a gate of an i-th fourth transistor paired with the i-th third transistor, from among the N fourth transistors, is supplied with the i-th bias voltage,
wherein the power amplifier comprises
a comparator that includes a first input terminal, a second input terminal, and an output terminal, and supplies the i-th bias voltage to at least one of the i-th third transistor and the i-th fourth transistor;
a capacitor that includes a first connection terminal and a second connection terminal, with the first connection terminal connected to the first input terminal and the second connection terminal supplied with the first voltage; and
a resistor that is connected between the first input terminal and a source of the at least one of the i-th third transistor and the i-th fourth transistor, and
wherein the comparator receives a reference voltage at the second input terminal thereof, and controls the i-th bias voltage such that a difference between a voltage at a source of the at least one of the i-th third transistor and the i-th fourth transistor and the first voltage is equal to the reference voltage.

* * * * *